United States Patent
Johanson et al.

(10) Patent No.: US 9,953,812 B2
(45) Date of Patent: Apr. 24, 2018

(54) INTEGRATED PROCESS KIT FOR A SUBSTRATE PROCESSING CHAMBER

(71) Applicant: APPLIED MATERIALS, INC., Santa Clara, CA (US)

(72) Inventors: William Johanson, Gilroy, CA (US); Kirankumar Savandaiah, Bangalore (IN); Xin Wang, Singapore (SG); Prashant Prabhu, Karwar (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 28 days.

(21) Appl. No.: 15/287,675

(22) Filed: Oct. 6, 2016

(65) Prior Publication Data

US 2017/0098530 A1 Apr. 6, 2017

(30) Foreign Application Priority Data

Oct. 6, 2015 (IN) .......................... 3217/DEL/2015

(51) Int. Cl.
| | |
|---|---|
| H01J 37/34 | (2006.01) |
| H01J 37/32 | (2006.01) |
| C23C 14/34 | (2006.01) |
| C23C 14/56 | (2006.01) |

(52) U.S. Cl.
CPC ...... H01J 37/3441 (2013.01); C23C 14/3407 (2013.01); C23C 14/564 (2013.01); H01J 37/32642 (2013.01); H01J 37/32651 (2013.01)

(58) Field of Classification Search
CPC ............... C23C 14/3407; C23C 14/564; H01J 37/32477; H01J 37/32522; H01J 37/32642; H01J 37/32651; H01J 37/3441

USPC .................................................... 204/298.11
See application file for complete search history.

(56) References Cited

U.S. PATENT DOCUMENTS

| | | | |
|---|---|---|---|
| 6,699,375 B1 * | 3/2004 | Crocker ............... | C23C 14/564 118/715 |
| 6,837,974 B2 | 1/2005 | Lawson et al. | |
| 7,981,262 B2 | 7/2011 | Pavloff et al. | |

(Continued)

OTHER PUBLICATIONS

U.S. Appl. No. 15/201,019, filed Jul. 1, 2016, Johanson et al.

(Continued)

*Primary Examiner* — Rodney G McDonald
(74) *Attorney, Agent, or Firm* — Moser Taboada; Alan Taboada

(57) ABSTRACT

Embodiments of process kits and process chambers incorporating same are provided herein. In some embodiments, a process kit includes: a one-piece process kit shield having a cylindrical body having an upper portion and a lower portion; an adapter section extending radially outward and having a resting surface to support the one-piece process kit shield on walls of a chamber and a sealing surface on which a chamber lid rests to seal off an inner volume of the chamber when the one-piece process kit shield is placed in the chamber; a heat transfer channel extending through the adapter section; and a protruding section extending radially inward from the lower portion; a resting bracket having an upper portion coupled to the adapter section and a lower portion extending radially inward; a cover ring disposed beneath the protruding section; and a deposition ring disposed beneath the cover ring.

20 Claims, 4 Drawing Sheets

(56) References Cited

U.S. PATENT DOCUMENTS

| | | |
|---|---|---|
| 8,221,602 B2* | 7/2012 | Brown .................. C23C 14/564 |
| | | 118/728 |
| 2003/0146084 A1 | 8/2003 | Fu |
| 2007/0095654 A1 | 5/2007 | Gopalraja |
| 2007/0102286 A1* | 5/2007 | Scheible ............. C23C 14/3407 |
| | | 204/298.01 |
| 2007/0209931 A1 | 9/2007 | Miller |
| 2008/0008523 A1 | 1/2008 | Hosokawa et al. |
| 2008/0078326 A1 | 4/2008 | Sung et al. |
| 2008/0141942 A1 | 6/2008 | Brown et al. |
| 2011/0303960 A1 | 12/2011 | Cao et al. |
| 2013/0277203 A1 | 10/2013 | Rasheed et al. |
| 2014/0027275 A1* | 1/2014 | Kao .................. H01J 37/32522 |
| | | 204/298.09 |
| 2014/0174910 A1 | 6/2014 | Dedontney |
| 2014/0190822 A1 | 7/2014 | Riker et al. |
| 2015/0114567 A1 | 4/2015 | Nagayama et al. |
| 2016/0189938 A1 | 6/2016 | Savandaiah et al. |

OTHER PUBLICATIONS

U.S. Appl. No. 15/260,190, filed Sep. 8, 2016, Johanson et al.
International Search Report and Written Opinion dated Mar. 29, 2016 for PCT Application No. PCT/US2015/064454.
International Search Report and Written Opinion dated Oct. 21, 2016 for PCT Application No. PCT/US2016/040847.
International Search Report and Written Opinion dated Dec. 15, 2016 for PCT Application No. PCT/US2016/061015.

* cited by examiner

INTEGRATED PROCESS KIT FOR A SUBSTRATE PROCESSING CHAMBER

CROSS-REFERENCE TO RELATED APPLICATIONS

This application claims the benefit of Indian Patent Application No. 3217/DEL/2015, filed with the Indian Patent Office on Oct. 6, 2015, which is herein incorporated by reference in its entirety.

FIELD

Embodiments of the present disclosure generally relate to substrate processing equipment.

BACKGROUND

A process kit shield may be used in, for example, a physical vapor deposition (PVD) chamber to separate a processing volume from a non-processing volume. In PVD chambers configured to deposit aluminum on a substrate, the process kit shield may be fabricated, for example, from stainless steel (SST). The SST process kit shield can be recycled multiple times as an aluminum layer deposited on the process kit shield during processing can be preferentially etched away from the base SST shield material. However, the inventors have been working on depositing relatively thick aluminum films on the substrate using significantly increased process power and deposition time as compared to conventional aluminum deposition processes.

For the thicker aluminum deposition process, the inventors have observed that the temperature of the process kit shield goes sufficiently high to undesirably result in whisker growth on the substrate. The inventors believe that whiskers are formed when the process kit surrounding the substrate does not have sufficient time to cool down between subsequent processes. The deposition process heats the substrate significantly more than the heated substrate support. Because the substrate is electrostatically chucked to the pedestal, the wafer is not free to bow under the thermal stress caused by the mismatch in the coefficient of thermal expansion (CTE) between the thick aluminum film and the substrate (e.g., silicon). When the film stress on the substrate gets high enough, whiskers pop out of the film to reduce the film stress. The inventors have further observed that high temperatures in the structures surrounding the substrate also adversely affect the reflectivity of the aluminum film deposited on the substrate. The temperature of the cover ring and shield play an important role in cooling the substrate via thermal radiation, and in minimizing whisker formation.

Furthermore, when the process kit undergoes thermal cycling from plasma heating and subsequent cooling while the plasma is off, a film deposited on the process kit experiences thermal stress that results from the mismatch in the CTE between the film and the underlying component material. When that stress exceeds the limits of adhesion, particles flake off of the process kit and land on the substrate.

To address the issues discussed above, a unitary process kit shield including an adapter, shield, and cover ring has been designed. However, the unitary process kit shield limits the spacing between the target and the substrate and brings a ground plane close to an edge of the substrate.

Accordingly, the inventors have provided embodiments of improved process kit.

SUMMARY

Embodiments of process kit shields and process chambers incorporating same are provided herein. In some embodiments, a process kit includes: a one-piece process kit shield having a cylindrical body having an upper portion and a lower portion; an adapter section extending radially outward and having a resting surface to support the one-piece process kit shield on walls of a chamber and a sealing surface on which a chamber lid rests to seal off an inner volume of the chamber when the one-piece process kit shield is placed in the chamber; a heat transfer channel extending through the adapter section; and a protruding section extending radially inward from the lower portion; a resting bracket having an upper portion coupled to the adapter section and a lower portion extending radially inward; a cover ring disposed beneath the protruding section; and a deposition ring disposed beneath the cover ring, wherein the cover ring rests on the lower portion of the resting bracket in a non-processing position, and wherein the cover ring rests on one of the deposition ring or an edge of a substrate in a processing position.

In some embodiments, a process chamber includes: a chamber wall defining an inner volume within the process chamber; a sputtering target disposed in an upper section of the inner volume; a substrate support having a support surface to support a substrate below the sputtering target; and a process kit, comprising: a one-piece process kit shield surrounding the sputtering target and the substrate support, wherein the one-piece process kit shield comprises: a cylindrical body having an upper portion and a lower portion; an adapter section extending radially outward and having a resting surface to support the one-piece process kit shield on walls of a chamber and a sealing surface on which a chamber lid rests to seal off the inner volume of the chamber when the one-piece process kit shield is placed in the chamber; a heat transfer channel extending through the adapter section; and a protruding section extending radially inward from the lower portion; a resting bracket having an upper portion coupled to the adapter section and a lower portion extending radially inward; a cover ring disposed beneath the protruding section; and a deposition ring disposed beneath the cover ring, wherein the cover ring rests on the lower portion of the resting bracket in a non-processing position, and wherein the cover ring rests on one of the deposition ring or an edge of the substrate in a processing position.

In some embodiments, a process kit includes: a one-piece process kit shield, having a cylindrical body having an upper portion and a lower portion; an adapter section extending radially outward and having a resting surface to support the one-piece process kit shield on walls of a chamber and a sealing surface on which a chamber lid rests to seal off an inner volume of the chamber when the one-piece process kit shield is placed in the chamber; a heat transfer channel extending through the adapter section; and an annular wedge extending radially inward from the lower portion of the cylindrical body; a resting bracket having an upper portion coupled to the adapter section and a lower portion extending radially inward; a cover ring having a radially outermost portion extending between the lower portion and the protruding section, wherein the cover ring is electrically floating; and a deposition ring disposed beneath the cover ring, wherein the cover ring rests on the lower portion of the resting bracket in a non-processing position, and wherein the cover ring rests on one of the deposition ring or an edge of a substrate in a processing position.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
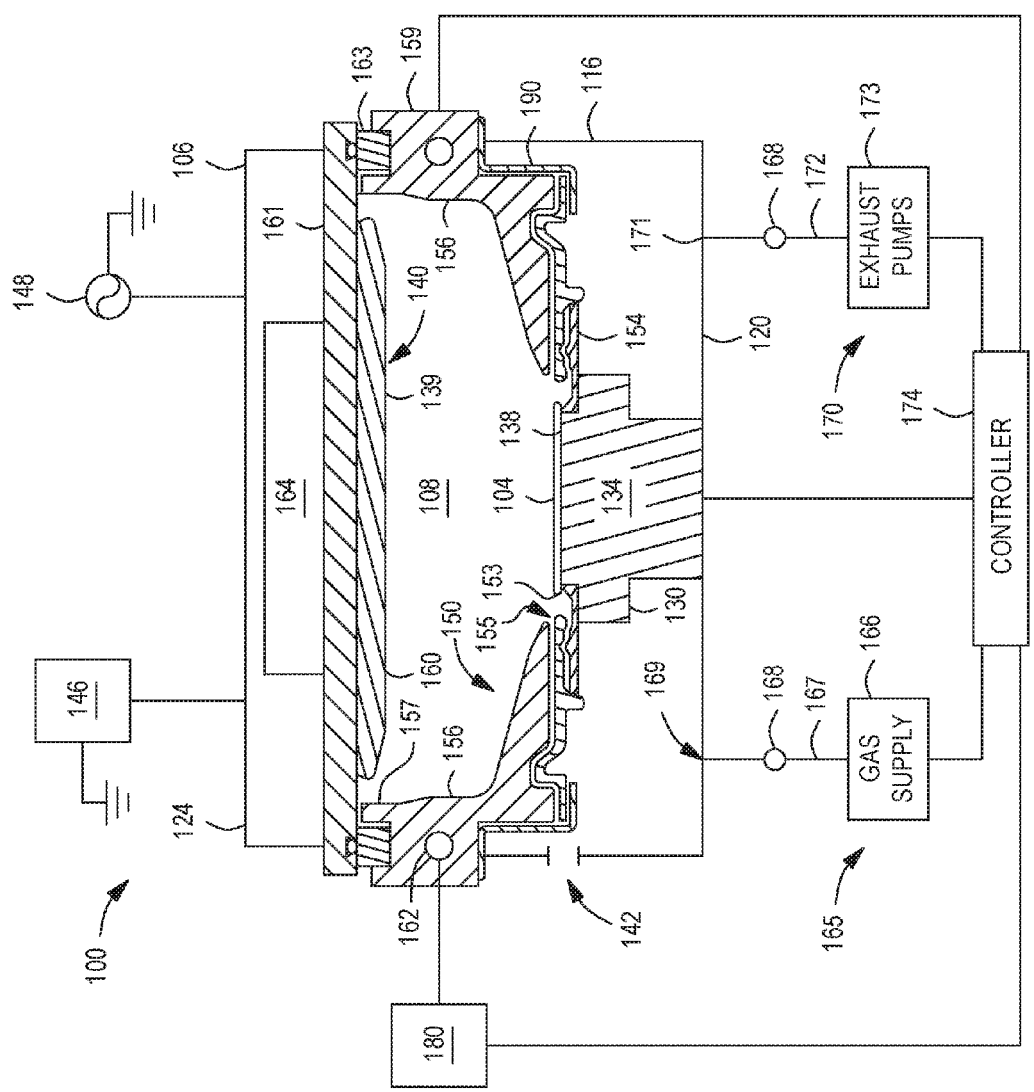
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kit shields and process chambers incorporating such process kit shields are provided herein. In some embodiments, a one-piece process kit shield including an adapter section and a cover ring are provided herein. The adapter section may include a heat transfer channel to cool the one-piece process kit shield. The one-piece process kit shield advantageously improves cooling of the shield and improved thermal conductivity between various portions of the shield, which were previously separate components.

FIG. 1 depicts a schematic, cross-sectional view of an illustrative process chamber 100 (e.g., a PVD chamber) having a process kit shield in accordance with some embodiments of the present disclosure. Examples of PVD chambers suitable for use with process kit shields of the present disclosure include the ALPS® Plus, SIP ENCORE®, and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 100 comprises chamber walls 106 that enclose an inner volume 108. The chamber walls 106 include sidewalls 116, a bottom wall 120, and a ceiling 124. The ceiling 124 may be a chamber lid or a similar cover to seal off the inner volume 108. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The pedestal 134 has a substrate support surface 138 having a plane substantially parallel to a sputtering surface 139 of a sputtering target 140 disposed in an upper section of the process chamber 100. The substrate support surface 138 of the pedestal 134 receives and supports the substrate 104 during processing. The pedestal 134 may include an electrostatic chuck or a heater (such as an electrical resistance heater, heat exchanger, or other suitable heating device). In operation, a substrate 104 is introduced into the process chamber 100 through a substrate loading inlet 142 in the sidewall 116 of the process chamber 100 and placed onto the substrate support 130. The substrate support 130 can be lifted or lowered by a support lift mechanism and a lift finger assembly can be used to lift and lower the substrate 104 onto the substrate support 130 during placement of the substrate 104 on the substrate support 130 by a robot arm. The pedestal 134 can be maintained at an electrically floating potential or grounded during plasma operation.

The process chamber 100 also contains a process kit 150, which comprises various components that can be easily removed from the process chamber 100, for example, to clean sputtering deposits off the component surfaces, replace or repair eroded components, or to adapt the process chamber 100 for other processes. The inventors have discovered that thermal resistances at contact interfaces a process kit shield, a process kit adapter, and a process kit cover ring adversely affect shield temperatures. Furthermore, low clamping forces between the shield and the adapter result in poor heat transfer between the adapter and the shield, even with coolant channels used to enhance heat transfer rates. The low heat transfer rate problem is further exacerbated with respect to the cover ring because the cover ring is a floating element (i.e., not coupled to the shield) that is further removed from the cooled adapter. The inventors have also discovered that a cover ring electrically coupled to the remainder of the shield brings the ground plane close to an edge of the substrate, thus adversely affecting the electron field near the edge of the substrate. As a result, the plasma proximate the substrate is distorted leading to deposition non-uniformity. Thus, the inventors have designed a process kit having a one-piece shield 151 that advantageously provides improved cooling/heating of the shield and the cover ring.

In some embodiments, the one-piece shield 151 includes a cylindrical body 156 having a diameter sized to encircle the sputtering surface 139 of the sputtering target 140 and the substrate support 130 (e.g., a diameter larger than the sputtering surface 139 and larger than the support surface of the substrate support 130). The cylindrical body 156 has an upper portion 157 that surrounds the outer edge of the sputtering surface 139 of the sputtering target 140 and a lower portion 158 that surrounds the substrate support 130. The upper portion 157 includes an adapter section 159 for supporting the one-piece shield 151 on the sidewall 116 and a cover ring 155 for placement about a peripheral wall 152 of the substrate support 130. The lower portion includes a radially inward protruding section (i.e., an annular wedge) that surrounds the substrate support 130.

The process kit 150 further comprises a deposition ring 154 disposed below the cover ring 155. A bottom surface of the cover ring 155 interfaces with the deposition ring 154. The cover ring 155 at least partially covers the deposition ring 154. The deposition ring 154 and cover ring 155 cooperate with one another to reduce formation of sputter deposits on the peripheral walls 152 of the substrate support 130 and an overhanging edge 153 of the substrate 104.

The one-piece shield 151 encircles the sputtering surface 139 of the sputtering target 140 that faces the substrate support 130 and the outer periphery of the substrate support 130. The one-piece shield 151 covers and shadows the sidewalls 116 of the process chamber 100 to reduce deposition of sputtering deposits originating from the sputtering surface 139 of the sputtering target 140 onto the components and surfaces behind the one-piece shield 151. For example, the one-piece shield 151 can protect the surfaces of the cover ring 155, the substrate support 130, overhanging edge 153 of the substrate 104, sidewalls 116 and bottom wall 120 of the process chamber 100.

Figure 2:
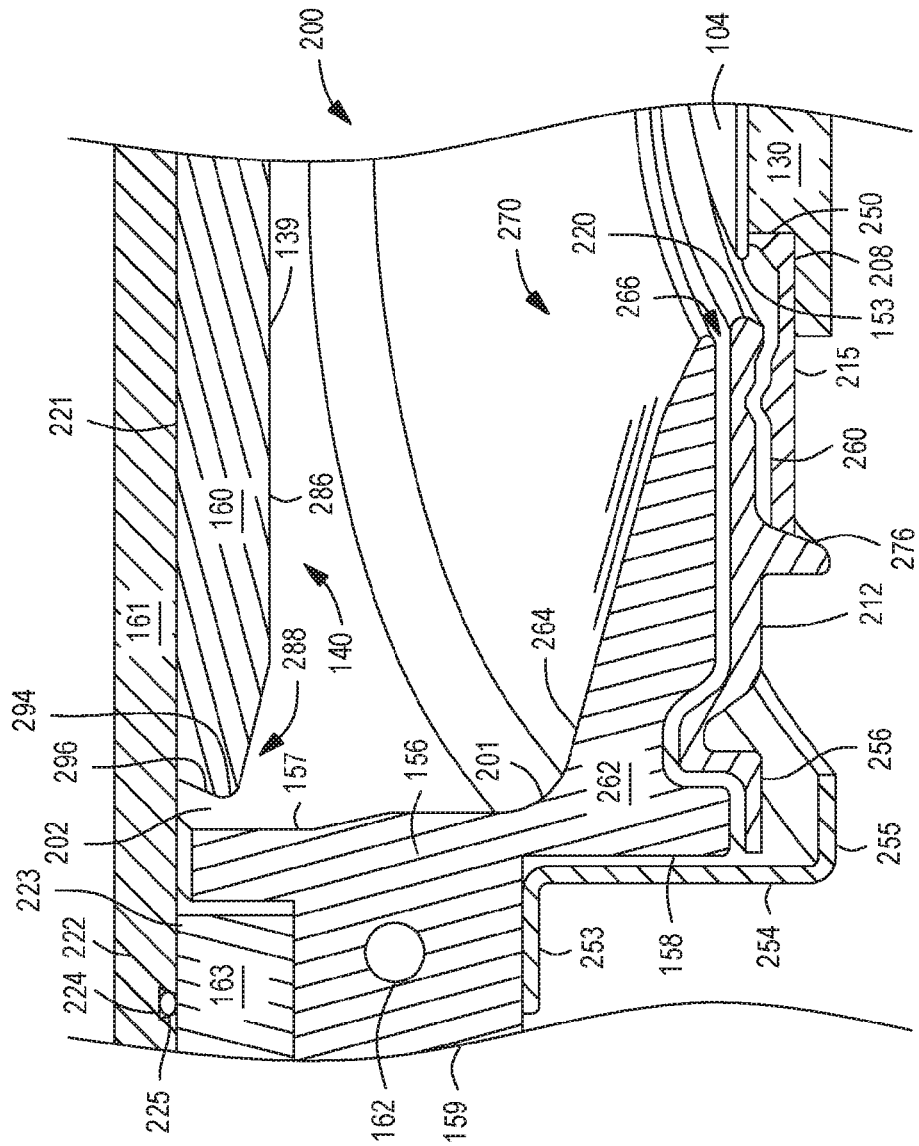
FIG. 2 depicts a schematic cross sectional view of a process kit shield in accordance with some embodiments of the present disclosure.
Figure 3:
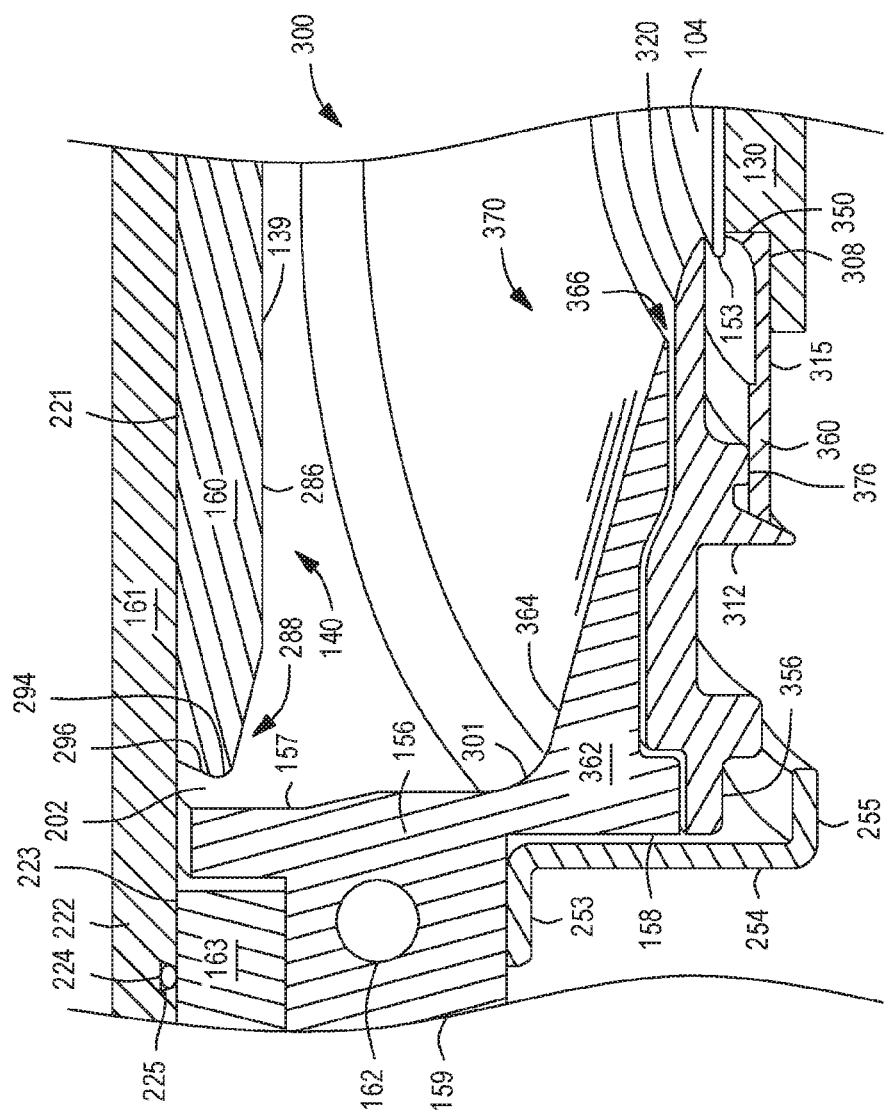
FIG. 3 depicts a schematic cross sectional view of a process kit shield in accordance with some embodiments of the present disclosure.
Figure 4:
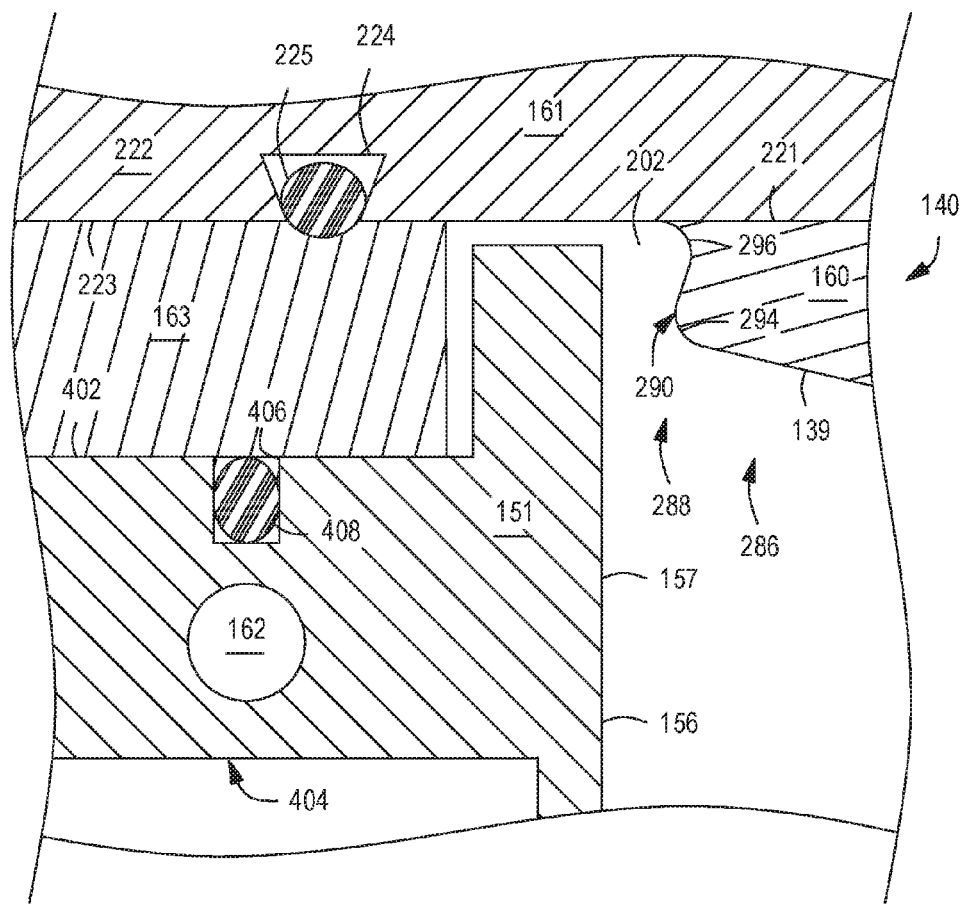
FIG. 4 depicts a schematic cross sectional view of an upper portion of a process kit shield in accordance with some embodiments of the present disclosure.

As shown in FIGS. 1-4, the adapter section 159 extends radially outward from the upper portion 157 and the cover ring section extends radially inward from the lower portion 158 of the cylindrical body 156. As shown in FIG. 4, the adapter section 159 includes a sealing surface 402 and a resting surface 404 opposite the sealing surface 402. The sealing surface 402 contains an O-ring groove 406 to receive an O-ring 408 to form a vacuum seal. The adapter section 159 comprises a resting surface 404 to rest upon the sidewalls 116 of the process chamber 100. As such, the adapter section 159 is bolted outside of the vacuum atmosphere inside of the process chamber 100, which advantageously improves heat dissipation.

The adapter section 159 supports the one-piece shield 151 and can serve as a heat exchanger about a sidewall 116 of the process chamber 100. In some embodiments, a heat transfer channel 162 is disposed in the upper portion 157 to flow a heat transfer medium. In some embodiments, the heat transfer channel 162 is disposed in the adapter section 159. Because the one-piece shield 151 is of unitary construction, the heat transfer medium flowing through the heat transfer channel 162 directly cools/heats the one-piece shield 151 and the cover ring 155. Furthermore, the unitary construction of the one-piece shield 151 advantageously allows for a direct coupling of a heat transfer medium supply 180 to the shield, which was previously indirectly coupled to a heat transfer supply via the adapter. The heat transfer medium supply 180 flows a heat transfer medium through the heat transfer channel 162 at a flowrate sufficient to maintain a desired shield temperature.

Furthermore, a shield with multiple components is more difficult and laborious to remove for cleaning. The one-piece shield 151 has a continuous surface exposed to the sputtering deposits without interfaces or corners that are more difficult to clean out. The one-piece shield 151 also more effectively shields the chamber walls 106 from sputter deposition during process cycles. In some embodiments, surfaces of the one-piece shield 151 exposed to the inner volume 108 in the process chamber 100 may be bead blasted to reduce particle shedding and prevent contamination within the process chamber 100.

FIG. 2 depicts a cross-sectional view of a process kit 200 in accordance with some embodiments of the present disclosure. The process kit 200 may be used as the process kit 150 depicted in FIG. 1. The process kit 200 includes a one-piece shield 201, a cover ring 212, and a deposition ring 208. The one-piece shield 201 allows better heat transfer from the one-piece shield 201 to the adapter section 159 and which reduces thermal expansion stresses on the material deposited on the shield. Portions of the one-piece shield 201 can become excessively heated by exposure to the plasma formed in the substrate processing chamber, resulting in thermal expansion of the shield and causing sputtering deposits formed on the shield to flake off from the shield and fall upon and contaminate the substrate 104. The unitary construction of the adapter section 159 and the cylindrical body 156 results in improved thermal conductivity between the adapter section 159 and the cylindrical body 156.

In some embodiments, the one-piece shield 201 comprises a unitary structure which is made from a monolith of material. For example, the one-piece shield 201 may be formed of stainless steel or aluminum. The unitary construction of the one-piece shield 201 is advantageous over conventional shields which include multiple components, often two or three separate pieces to make up the complete shield. For example, a single piece shield is more thermally uniform than a multiple-component shield, in both heating and cooling processes. For example, the one-piece shield 201 eliminates thermal interfaces between the cylindrical body 156 and the adapter section 159, allowing for more control over the heat exchange between these sections. In some embodiments, the heat transfer medium supply 180 flows a coolant through the heat transfer channel 162 to combat the adverse effects of an overheated shield on the sputtered material deposited on the substrate 104, as explained above. In some embodiments, the heat transfer medium supply 180 flows a heated fluid through the heat transfer channel 162 to mitigate the difference between the coefficients of the thermal expansion of the sputtered material and the shield.

The cover ring 212 is disposed beneath the lower portion 158, which is configured to cover all but a projecting portion 220 of the cover ring 212 to shield the cover ring 212 from a heat flux of the plasma formed in the chamber. A gap 266 is formed between the lower portion 158 and the cover ring 212 to provide electrical isolation between the one-piece shield 201 and the cover ring 212 and thus, the substrate 104. The projecting portion 220 is spaced apart from the substrate 104 to advantageously provide further electrical isolation between the substrate 104 and the one-piece shield 201. The gap 266 also serves to allow for heat transfer from the cover ring 212 to the one-piece shield 201 through radiation, thus advantageously reducing whisker growth on the substrate 104.

The process kit 200 further includes a resting bracket 254 having an upper portion 253 coupled to the bottom of the adapter section 159 and lower portion 255 to support the cover ring 212. The lower portion 255 extends radially inward beneath a radially outermost portion 256 of the cover ring 212 to support the cover ring 212 in a non-processing position. The radially outermost portion 256 of the cover ring 212 extends between the lower portion 255 and the annular wedge 262.

The deposition ring 208 comprises an annular band 215 that extends about and surrounds the peripheral wall of the substrate support 130 as shown in FIG. 2. The annular band 215 comprises an inner lip 250 which extends transversely from the annular band 215 and is substantially parallel to the peripheral wall of the substrate support 130. The inner lip 250 terminates immediately below the overhanging edge 153 of the substrate 104. The inner lip 250 defines an inner perimeter of the deposition ring 208 which surrounds the periphery of the substrate 104 and substrate support 130 to protect regions of the substrate support 130 that are not covered by the substrate 104 during processing. For example, the inner lip 250 surrounds and at least partially covers the peripheral wall of the substrate support 130 that would otherwise be exposed to the processing environment, to reduce or even entirely preclude deposition of sputtering deposits on the peripheral wall. Advantageously, the deposition ring 208 can be easily removed to clean sputtering deposits from the exposed surfaces of the deposition ring 208 so that the substrate support 130 does not have to be dismantled to be cleaned. The deposition ring 208 can also serve to protect the exposed side surfaces of the substrate support 130 to reduce their erosion by the energized plasma species. The deposition ring 208 also has a ledge 260 which serves to partially support the cover ring 212, thus providing an additional support for the cover ring 212.

The cover ring 212 encircles and at least partially covers the deposition ring 208 to receive, and thus, shadow the deposition ring 208 from the bulk of the sputtering deposits. The lower portion 158 of the one-piece shield 201 comprises an annular wedge 262 comprising an inclined upper surface 264 that is sloped radially inwards and encircles the substrate support 130. The inclined upper surface 264 of the annular wedge 262 has an inner periphery including a projecting brim 270 which overlies the cover ring 212. The projecting brim 270 reduces deposition of sputtering deposits on the cover ring 212 and the deposition ring 154. The projecting brim 270 is sized, shaped, and positioned to cooperate with and complement the cover ring 212 and deposition ring 208, thus inhibiting the flow of process deposits onto the peripheral wall. As such, the cover ring 212 and the deposition ring 208 include opposing mating surfaces to reduce formation of sputter deposits on a periphery of the substrate support 130 when the cover ring 212 rests on the deposition ring 208 during processing. The cover ring 212 may also include an annular projection 276 to correctly align the cover ring 212 with the deposition ring 208 during assembly.

As shown in FIGS. 1-4, the sputtering target 140 comprises a sputtering plate 160 mounted to a backing plate 161. The sputtering plate 160 comprises a material to be sputtered onto the substrate 104. The sputtering plate 160 may have a central cylindrical mesa 286 having the sputtering surface 139 that forms a plane that is parallel to the plane of the substrate 104. An annular inclined rim 288 surrounds the cylindrical mesa 286. The annular inclined rim 288 nay be inclined relative to the plane of the cylindrical mesa 286 by an angle of at least about 8°, for example, from about 10° to about 20°. A peripheral inclined sidewall 290 having a protrusion 294 and a recess 296 surrounds the annular inclined rim 288. The peripheral incline sidewall 290 may be inclined relative to the plane of the cylindrical mesa 286 by an angle of at least about 60°, for example, from about 75° to about 85°.

The complex shape of the annular inclined rim 288 and peripheral inclined sidewall 290 that is adjacent to the upper portion 157 of the one-piece shield 151 forms a convoluted gap 202 comprising a dark space region. The dark space region is an area which is highly depleted of free electrons and which can be modeled as a vacuum. Control of the dark space region advantageously prevents plasma entry into the dark space region, arcing, and plasma instability. The shape of the gap 202 acts as a labyrinth that impedes the passage of sputtered plasma species through the gap 202, and thus, reduces the accumulation of sputtered deposits on the surfaces of the peripheral target region.

The sputtering plate 160 comprises a metal or metal compound. For example, the sputtering plate 160 can be a metal, such as, for example aluminum, copper, tungsten, titanium, cobalt, nickel or tantalum. The sputtering plate 160 can also be a metal compound, such as for example, tantalum nitride, tungsten nitride or titanium nitride.

The backing plate 161 which has a support surface 221 to support the sputtering plate 160 and a peripheral ledge 222 that extends beyond the radius of the sputtering plate 160. The backing plate 161 is made from a metal, such as, for example, stainless steel, aluminum, coper-chromium or copper-zinc. The backing plate 161 can be made from a material having a thermal conductivity sufficient to dissipate the heat generated in the sputtering target 140 and/or the backing plate 161. The heat is generated from the eddy currents that arise in the sputtering and backing plates 160, 161 and also from the bombardment of energetic ions from the plasma onto the sputtering surface 139 of the sputtering target 140. The higher thermal conductivity backing plate 161 allows dissipation of the heat generated in the sputtering target 140 to the surrounding structures or even to a heat exchanger which may be mounted behind the backing plate 161 or may be in the backing plate 161, itself. For example, the backing plate 161 can comprise channels (not shown) to circulate a heat transfer fluid therein. A suitably high thermal conductivity of the backing plate 161 is at least about 150 W/mK, for example, from about 220 to about 500 W/mK. Such a thermal conductivity level allows the sputtering target 140 to be operated for longer process time periods by dissipating the heat generated in the sputtering target 140 more efficiently.

In combination with a backing plate 161 made of a material having a high thermal conductivity and low resistivity, or separately and by itself, the backing plate 161 may comprises a backside surface having one or more grooves (not shown). For example, a backing plate 161 could have a groove, such as annular groove, or a ridge, for cooling the backside 141 of the sputtering target 140. The grooves and ridges can also have other patterns, for example, rectangular grid pattern, chicken feet patterns, or simply straight lines running across the backside surface.

In some embodiments, the sputtering plate 160 may be mounted on the backing plate 161 by diffusion bonding, by placing the sputtering and backing plates 160, 161 on each other and heating the sputtering and backing plates 160, 161 to a suitable temperature, typically at least about 150° C. Optionally, the sputtering target 140 may be a monolithic structure comprising a single piece of material having enough depth to serve as both the sputtering plate and backing plate.

The peripheral ledge 222 of the backing plate 161 comprises an outer footing 223 that rests on an isolator 163 in the process chamber 100 (FIGS. 2 and 3). The peripheral ledge 222 contains an O-ring groove 224 into which an O-ring 225 is placed to form a vacuum seal. The isolator 163 electrically isolates and separates the backing plate 161 from the process chamber 100, and is typically a ring formed of a dielectric or insulative material such as aluminum oxide. The peripheral ledge 222 is shaped to inhibit the flow or migration of sputtered material and plasma species through a gap between the sputtering target 140 and the isolator 163, to impede the penetration of low-angle sputtered deposits into the gap.

FIG. 3 depicts a cross-sectional view of a process kit 300 in accordance with some embodiments of the present disclosure. The process kit 300 may alternatively be used as the process kit 150 depicted in FIG. 1. Because the process kit 300 is similar to the process kit 200 described above with respect to FIG. 2, a description of the same or similar elements will be omitted here.

The process kit 300 includes a one-piece shield 301, a cover ring 312, and a deposition ring 308. The process kit 300 differs from the process kit 200 in that the lower portion 158 of the process kit 300 is configured differently than the lower portion 158 of the process kit 200 to accommodate the cover ring 312, which is shaped differently than the cover ring 212.

The cover ring 312 is disposed beneath the lower portion 158, which is configured to cover all but a projecting portion 320 of the cover ring 312 to shield the cover ring 312 from the heat flux of the plasma formed in the chamber. A gap 366 is formed between the lower portion 158 and the cover ring 312 to provide electrical isolation between the one-piece shield 301 and the cover ring 312 and, thus the substrate 104. The gap 366 also serves to allow for heat transfer from the cover ring 312 to the one-piece shield 301 through radiation, thus advantageously reducing whisker growth on the substrate 104. In contrast to the cover ring 212, the projecting portion 320 of the cover ring 312 extends over a peripheral edge of the substrate 104 to act as a shadow ring prevent materials from being deposited on the peripheral edge. The cover ring 312 further includes a radially outermost portion 356 that rests on the lower portion 255 of the bracket 254 in a non-processing position. The radially outermost portion 356 of the cover ring 312 extends between the lower portion 255 and the annular wedge 362.

The deposition ring 308 comprises an annular band 315 that extends about and surrounds the peripheral wall of the substrate support 130 as shown in FIG. 3. The annular band 315 comprises an inner lip 350 which extends transversely from the annular band 315 and is substantially parallel to the peripheral wall of the substrate support 130. The inner lip 350 terminates immediately below the overhanging edge 153 of the substrate 104. The inner lip 350 defines an inner perimeter of the deposition ring 308 which surrounds the periphery of the substrate 104 and substrate support 130 to protect regions of the substrate support 130 that are not covered by the substrate 104 during processing. For example, the inner lip 350 surrounds and at least partially covers the peripheral wall of the substrate support 130 that would otherwise be exposed to the processing environment, to reduce or even entirely preclude deposition of sputtering deposits on the peripheral wall. Advantageously, the deposition ring 308 can be easily removed to clean sputtering deposits from the exposed surfaces of the deposition ring 308 so that the substrate support 130 does not have to be dismantled to be cleaned. The deposition ring 308 can also serve to protect the exposed side surfaces of the substrate support 130 to reduce their erosion by the energized plasma species. The deposition ring 308 also has a ledge 360 which serves to partially support the cover ring 312, thus providing an additional support for the one-piece shield 301.

The cover ring 312 encircles and covers the deposition ring 308 and the peripheral edge of the substrate 104 to receive, and thus, shadow the deposition ring 308 and the substrate 104 from the bulk of the sputtering deposits. The lower portion 158 of the one-piece shield 301 comprises an annular wedge 362 comprising an inclined upper surface 364 that is sloped radially inwards and encircles the substrate support 130. The inclined upper surface 364 of the annular wedge 362 has an inner periphery including a projecting brim 370 which overlies the cover ring 312. The projecting brim 370 reduces deposition of sputtering deposits on the cover ring 312. The projecting brim 370 is sized, shaped, and positioned to cooperate with and complement the cover ring 312, thus inhibiting the flow of process deposits onto the peripheral wall. The cover ring 312 comprises a footing 376 extending downward from the inclined upper surface 364 of the annular wedge 362, to rest upon the ledge 360 of the deposition ring 308. The footing 376 extends downwardly from the annular wedge 362 to press against the deposition ring 308 substantially without cracking or fracturing the deposition ring 308.

Figure 5:
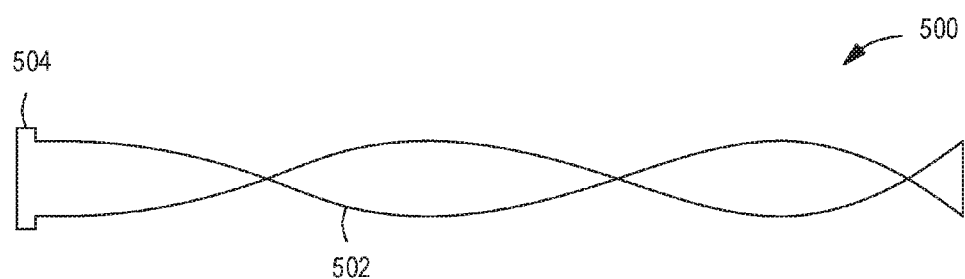
FIG. 5 depicts a schematic side view of a turbulence generator for use in a process kit shield in accordance with some embodiments of the present disclosure.

FIG. 5 illustrates a turbulence generator 500 in accordance with some embodiments of the present disclosure. In some embodiments, the heat transfer channel 162 may include one or more turbulence generators 500 (shown in FIG. 4). The turbulence generator 500 includes a helically shaped body to induce turbulence in the flow of the heat transfer medium and a base 504. The base 504 is configured to engage with walls of the heat transfer channel 162 to prevent the turbulence generator 500 from moving as the heat transfer medium flows past the turbulence generator 500. The turbulence induced by the turbulence generator 500 advantageously improves the rate of heat transfer between the heat transfer medium and the one-piece shield 151.

Returning to FIG. 1, the sputtering target 140 is connected to one or both of a DC power source 146 and an RF power source 148. The DC power source 149 can apply a bias voltage to the sputtering target 140 relative to the one-piece shield 151, which may be electrically floating during a sputtering process. While the DC power source 146 supplies power to the sputtering target 140, the one-piece shield 151, the substrate support 130, and other chamber components connected to the DC power source 146, the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In some embodiments, the process chamber 100 may include a magnetic field generator 164 disposed above the sputtering target 140 to shape a magnetic field about the sputtering target 140 to improve sputtering of the sputtering target 140. The capacitively generated plasma may be enhanced by a magnetic field generator 164 in which for example, a permanent magnet or electromagnetic coils may provide a magnetic field in the process chamber 100 that has a rotating magnetic field having a rotational axis that is perpendicular to the plane of the substrate 104. The process chamber 100 may, in addition or alternatively, comprise a magnetic field generator 164 that generates a magnetic field near the sputtering target 140 of the process chamber 100 to increase an ion density in a high-density plasma region adjacent to the sputtering target 140 to improve the sputtering of the target material.

The sputtering gas is introduced into the process chamber 100 through a gas delivery system 165, which provides gas from a gas supply 166 via conduits 167 having gas flow control valves 168, such as a mass flow controllers, to pass a set flow rate of the gas through the gas flow control valves 168. The gases are fed to a mixing manifold (not shown) in which the gases are mixed to from a desired process gas composition and fed to a gas distributor 169 having gas outlets to introduce the gas into the process chamber 100. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that are capable of reacting with the sputtered material to form a layer on the substrate 104. The gas is then energized by the RF power source 148 to form a plasma to sputter the sputtering target 140. Spent process gas and byproducts are exhausted from the process chamber 100 through an exhaust 170. The exhaust 170 comprises an exhaust port 171 that receives spent process gas and passes the spent gas to an exhaust conduit 172 having a throttle valve to control the pressure of the gas in the process chamber 100. The exhaust conduit 172 is connected to one or more exhaust pumps 173.

Various components of the process chamber 100 may be controlled by a controller 174. The controller 174 comprises program code having instruction sets to operate the components to process a substrate 104. For example, the controller 174 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate the RF power source 148 to set a gas energizing power level; temperature control instruction sets to control a temperature control system in the substrate support 130 or the heat transfer medium supply 180 to control a flowrate of the heat transfer medium to the heat transfer channel 162; and process monitoring instruction sets to monitor the process in the process chamber 100.

While the foregoing is directed to embodiments of the present disclosure, other and further embodiments of the disclosure may be devised without departing from the basic scope thereof.

The invention claimed is:

1. A process kit, comprising:
 a one-piece process kit shield, comprising:
  a cylindrical body having an upper portion and a lower portion;
  an adapter section extending radially outward and having a resting surface to support the one-piece process kit shield on walls of a chamber and a sealing surface on which a chamber lid rests to seal off an inner volume of the chamber when the one-piece process kit shield is placed in the chamber;
  a heat transfer channel extending through the adapter section; and
  a protruding section extending radially inward from the lower portion;
 a resting bracket having an upper portion coupled to the adapter section and a lower portion extending radially inward;
 a cover ring disposed beneath the protruding section; and
 a deposition ring disposed beneath the cover ring, wherein the cover ring rests on the lower portion of the resting bracket in a non-processing position, and wherein the cover ring rests on one of the deposition ring or an edge of a substrate in a processing position.

2. The process kit of claim 1, wherein the cover ring and the deposition ring include opposing mating surfaces.

3. The process kit of claim 1, further comprising:
 a turbulence generator disposed within the heat transfer channel.

4. The process kit of claim 1, wherein the one-piece process kit shield is formed of aluminum.

5. The process kit of claim 1, wherein the one-piece process kit shield is formed of stainless steel.

6. The process kit of claim 1, wherein the cover ring includes an annular projection to align the cover ring with the deposition ring.

7. The process kit of claim 1, wherein the cover ring includes a footing configured to rest on a ledge of the deposition ring.

8. The process kit of claim 1, wherein the cover ring includes a radially outermost portion that extends between the lower portion of the resting bracket and the protruding section of the one-piece process kit shield.

9. A process chamber, comprising:
 a chamber wall defining an inner volume within the process chamber;
 a sputtering target disposed in an upper section of the inner volume;
 a substrate support having a support surface to support a substrate below the sputtering target; and
 a process kit, comprising:
  a one-piece process kit shield surrounding the sputtering target and the substrate support, wherein the one-piece process kit shield comprises:
   a cylindrical body having an upper portion and a lower portion;
   an adapter section extending radially outward and having a resting surface to support the one-piece process kit shield on walls of a chamber and a sealing surface on which a chamber lid rests to seal off the inner volume of the chamber when the one-piece process kit shield is placed in the chamber;
   a heat transfer channel extending through the adapter section; and
   a protruding section extending radially inward from the lower portion;
  a resting bracket having an upper portion coupled to the adapter section and a lower portion extending radially inward;
  a cover ring disposed beneath the protruding section; and
  a deposition ring disposed beneath the cover ring, wherein the cover ring rests on the lower portion of the resting bracket in a non-processing position, and wherein the cover ring rests on one of the deposition ring or an edge of the substrate in a processing position.

10. The process chamber of claim 9, wherein a first portion of the adapter section is disposed within the inner volume and a second portion of the adapter section is disposed outside of the inner volume.

11. The process chamber of claim 10, further comprising:
 a heat transfer medium supply coupled to the second portion to supply a heat transfer medium to the heat transfer channel.

12. The process chamber of claim 9, wherein the one-piece process kit shield further comprises:
 a turbulence generator disposed within the heat transfer channel.

13. The process chamber of claim 9, wherein the cover ring and the deposition ring include opposing mating surfaces to reduce formation of sputter deposits on a periphery of the substrate support when the cover ring rests on the deposition ring during processing.

14. The process chamber of claim 9, wherein the sealing surface includes O-ring groove to receive an O-ring to form a vacuum seal between the adapter section and the chamber lid.

15. The process chamber of claim 9, wherein a periphery of the sputtering target adjacent the upper portion is configured to form a convoluted gap having a dark space region.

16. The process chamber of claim 9, wherein the cover ring includes an annular projection to align the cover ring with the deposition ring when the cover ring rests on the deposition ring during processing.

17. The process chamber of claim 9, wherein the cover ring includes a footing configured to rest on a ledge of the deposition ring when the cover ring rests on the edge of the substrate during processing.

18. The process chamber of claim 9, wherein the cover ring includes a radially outermost portion that extends between the lower portion of the resting bracket and the protruding section of the one-piece process kit shield.

19. The process chamber of claim 9, further comprising:
a magnetic field generator disposed above the sputtering target to shape a magnetic field about the sputtering target.

20. A process kit, comprising:
a one-piece process kit shield, comprising:
  a cylindrical body having an upper portion and a lower portion;
  an adapter section extending radially outward and having a resting surface to support the one-piece process kit shield on walls of a chamber and a sealing surface on which a chamber lid rests to seal off an inner volume of the chamber when the one-piece process kit shield is placed in the chamber;
  a heat transfer channel extending through the adapter section; and
  an annular wedge extending radially inward from the lower portion of the cylindrical body;
a resting bracket having an upper portion coupled to the adapter section and a lower portion extending radially inward;
a cover ring disposed beneath the annular wedge and having a radially outermost portion extending between the lower portion and the annular wedge, wherein the cover ring is electrically floating; and
a deposition ring disposed beneath the cover ring, wherein the cover ring rests on the lower portion of the resting bracket in a non-processing position, and wherein the cover ring rests on one of the deposition ring or an edge of a substrate in a processing position.

\* \* \* \* \*